(12) United States Patent
Özdemir et al.

(10) Patent No.: US 12,088,252 B2
(45) Date of Patent: Sep. 10, 2024

(54) TUNING RANGE ENHANCEMENT BY NEGATIVE RESISTANCE

(71) Applicant: Telefonaktiebolaget LM Ericsson (publ), Stockholm (SE)

(72) Inventors: Ufuk Özdemir, Lund (SE); Peter Caputa, Limhamn (SE); Mustafa Özen, Gothenburg (SE); Ahmed Mahmoud, Lund (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 475 days.

(21) Appl. No.: 17/426,376

(22) PCT Filed: Jan. 30, 2019

(86) PCT No.: PCT/EP2019/052185
§ 371 (c)(1),
(2) Date: Jul. 28, 2021

(87) PCT Pub. No.: WO2020/156647
PCT Pub. Date: Aug. 6, 2020

(65) Prior Publication Data
US 2022/0085759 A1    Mar. 17, 2022

(51) Int. Cl.
*H03F 3/24* (2006.01)
*H03B 5/12* (2006.01)
*H03F 3/191* (2006.01)

(52) U.S. Cl.
CPC ......... *H03B 5/1206* (2013.01); *H03F 3/245* (2013.01); *H03F 2200/165* (2013.01); *H03F 2200/451* (2013.01)

(58) Field of Classification Search
CPC .. H03B 5/1206; H03B 5/1215; H03B 5/1228; H03B 5/1265; H03F 3/245;
(Continued)

(56) References Cited

U.S. PATENT DOCUMENTS

| 5,812,020 A | 9/1998 | Raghavan et al. |
| 6,317,008 B1 | 11/2001 | Gabara |

(Continued)

FOREIGN PATENT DOCUMENTS

| JP | 2008148210 A | 6/2008 |
| WO | 2010055619 A1 | 5/2010 |
| WO | 2016099722 A1 | 6/2016 |

OTHER PUBLICATIONS

Ericsson, "Protection of EESS (Passive) in 23.6-24 GHz", Status and actions 180205, Media Strategy 2016, Ericsson Internal, Feb. 2, 2016, 1-9.
(Continued)

*Primary Examiner* — Hieu P Nguyen
(74) *Attorney, Agent, or Firm* — Murphy, Bilak & Homiller, PLLC

(57) ABSTRACT

A tank circuit (200) includes a tunable resonator subcircuit (210) having a first control input and having an effective parallel resistance that varies with tuning of the tunable resonator subcircuit (210). The tank circuit (200) further comprises a variable negative-resistance subcircuit (250) having a second control input and coupled in parallel to the tunable resonator subcircuit (210), where the variable negative-resistance subcircuit (250) is configured to provide a variable negative resistance, responsive to the control input, so as to increase the effective parallel resistance of the tank circuit (200).

21 Claims, 7 Drawing Sheets

(58) Field of Classification Search
CPC ........ H03F 2200/165; H03F 2200/451; H03H 2210/012; H03H 2210/021; H03H 2210/025; H03H 11/06; H03H 11/52
USPC .................................. 330/301–305, 252–261
See application file for complete search history.

(56) References Cited

U.S. PATENT DOCUMENTS

| | | | |
|---|---|---|---|
| 8,098,101 B2* | 1/2012 | Savla | H03F 3/193 330/253 |
| 8,526,907 B2 | 9/2013 | Sivonen et al. | |
| 8,548,410 B2 | 10/2013 | Jussila et al. | |
| 9,813,033 B2* | 11/2017 | Testi | H03F 3/45188 |
| 2003/0020544 A1 | 1/2003 | Behzad | |
| 2011/0090017 A1 | 4/2011 | Chen et al. | |
| 2012/0092081 A1 | 4/2012 | Upadhyaya et al. | |
| 2013/0136211 A1 | 5/2013 | Jussila et al. | |

OTHER PUBLICATIONS

Razavi, Behzad, "The Cross-Coupled Pair—Part I", IEEE Solid-States Circuit Magazine, Summer 2014, Aug. 26, 2014, 7-10.
Zuzek, John, "Earth Exploration-Satellite Service (EESS)—Passive Spaceborne Remote Sensing", ITU/WMO Seminar on Spectrum & Meteorology, Geneva, Switzerland, Sep. 16-17, 2009, 1-25.

* cited by examiner

TUNING RANGE ENHANCEMENT BY NEGATIVE RESISTANCE

TECHNICAL FIELD

The present disclosure is generally related to resonator circuits, such as are commonly used in transceiver circuits, and is more particularly concerned with tunable resonator circuits and techniques for enhancing the tuning range of such circuits.

BACKGROUND

Tunable resonators, such as LC tanks or transformer-capacitor tanks, are widely used in transceivers, typically to resonate out all capacitances, including parasitics, with an inductor so that only a resistive load or source is presented to a load-sensitive circuit, such as a mixer or amplifier circuit. At and near their resonant frequencies, these circuits also increase output voltage swing limits to twice the supply voltage, which can improve linearity and make supply biasing for active circuits easier.

A "tank circuit," as that term is used herein, is a combination of circuit elements, such as an inductor or transformer in parallel with a capacitor, that has a resonant frequency, which is a frequency at which the reactances (for a resonator with elements in series) or susceptances (for a resonator with elements in parallel) cancel or are minimized, leaving only (or primarily) an effective resistance or effective conductance. These circuits are typically "tuned," meaning that capacitances or inductances of one or more elements in the circuit are selected or controlled to produce a resonance at a desired frequency, such as the center frequency of a desired operating range for a transmitter or receiver circuit. Commonly, these circuits comprise a capacitive element in parallel with an inductive element, but the term "tank circuit" as used herein may also apply to series-resonant circuits.

Tank circuits may comprise adjustable or tunable elements, so that the resonance can be adjusted before or during operation. This is often done using switched capacitor banks or varactors, particularly in integrated circuits, since inductors used in the resonators usually consume significant silicon area on radio application-specific integrated circuits (ASICs), making it impractical to have several of them connected to a common node to produce a switched inductor. Commonly, the non-linear behavior of varactors (non-linear changes in capacitance, with respect to the tuning voltage) limit their use to fine, i.e., narrow-range, tuning. Capacitor banks are thus typically employed for coarse tuning. Thanks to the small feature size of CMOS technologies, it is possible to make transistor switches with very low on resistance (Ron), which then are used to switch in or out capacitors in a capacitor bank. However, the tuning range of such a resonator is still limited, mainly by the Q-degradation of the resonator when all capacitors are switched in, i.e., at low frequencies.

As is well known to analog circuit designers, "Q," or "quality factor," is a parameter that is closely related to the useful bandwidth of a circuit, and is formally defined as:

$$Q = \frac{2\pi \times \text{maximum instantaneous energy stored in the circuit}}{\text{energy dissipated per cycle}}.$$

It will be appreciated that this parameter is proportional to the ratio of the effective reactance of the circuit to its effective resistance. Thus, as the resistances in a resonant circuit increase, relative to the circuit's reactance, e.g., as capacitors in a switched capacitor bank are switched in or output, the resonant circuit's Q degrades (i.e., gets smaller), which means that losses in the circuit increase and the bandwidth of the resonance gets wider. The former effect can adversely affect overall circuit gains and/or noise performance, while the latter effect can make a tunable resonant circuit less effective at filtering out undesired signals at some operating frequencies (e.g., at the lowest resonant frequencies) than at others.

In some circuits, a very wide range of tunable resonant frequencies is desirable. This may be the case, for example, in a radio transceiver circuit designed for selective operation in any of multiple frequency bands, such as new high-frequency bands (e.g., in the 24-30 GHz range) designated for fifth-generation (5G) wireless communications. Such circuits might include, for example, a transmitter circuit comprising a single power amplifier fed by an upconverting mixer circuit, such as is illustrated in FIG. 1.

In the example circuit shown in FIG. 1, a current-driven active mixer 110 is employed. This may be implemented as a switching cascode from the baseband, isolating the baseband input from the load. The mixer core, which may be based on a gilbert cell, for example is connected to a cascode resonator stage featuring a fixed-frequency input resonator 120 and a tunable output tank 140, which is coupled to a power amplifier stage 150. The illustrated tunable output tank 140 includes a variable capacitor element 145, which may be a capacitor bank, as discussed above, as well as an inductive element 147, which is a transformer element in the example circuit of FIG. 1. A generally constant Q (i.e., varying over a relatively small range) is desired for the tunable resonator 140 in the transmitter chain, to filter out unwanted repeated spectrum and noise peaking from the preceding digital-to-analog converter (DAC) and low-pass filter, respectively. At the same time, the target Q-value may be chosen to match the bandwidth requirements for a digital pre-distortion (DPD) block preceding the illustrated circuit, so that the pre-distortion of the signal remains as expected when the signal reaches the input of power amplifier 150. In addition, the low-Q input resonator 120 presents a low impedance to the mixer 110, keeping down the voltage swing on the mixer 110 output. This is necessary to meet requirements on frequency tilt in the output spectrum. Therefore, it is desirable for the tunable output resonator tank 140 to cover the desired frequency tuning range while keeping a constant Q.

However, when a circuit like that shown in FIG. 1 is required to operate over a very wide frequency-range, necessitating a wide tuning range for the resonant frequency of the tank circuit 140, maintaining a constant Q is very difficult, or impossible. As discussed above, while a switched capacitor bank can provide a wide tuning range, the Q can degrade significantly across that tuning range, typically at the low end of the range. In a power amplifier circuit like that shown in FIG. 1, this can result in undesirable gain drops across the operating band, as well as in problems with suppressing spurious frequencies from the transmitter output.

SUMMARY

According to several of the techniques and circuits described herein, the problems discussed above are addressed by connecting a variable negative resistance to the ports of a tuned resonator circuit, to restore its Q and effective parallel resistance (Rp) in regions of the operating frequency range where these parameters would otherwise be degraded. In some embodiments, the negative resistance may be selectively introduced only at the tuning settings where Q and Rp enhancement are necessary; multiple values of negative resistance may be selected in some embodiments, while a continuous range of negative resistances may be available in other embodiments.

In practice, the techniques and circuits described herein can be used to enhance the usable frequency range of a tunable resonator, since both Q and Rp, which correspond to circuit bandwidth and transimpedance/gain, respectively, are made adjustable or programmable, so that their variations can be kept within acceptable limits over a wider frequency range. The switching in of negative resistance and its value is programmable, in various embodiments, so that only the needed amount of negative resistivity is applied, thereby avoiding excessive Q increase and/or possible circuit instability.

An example tank circuit according to some of the embodiments described herein includes a tunable resonator subcircuit having a first control input and having an effective parallel resistance that varies with tuning of the tunable resonator subcircuit. The tank circuit further comprises a variable negative-resistance subcircuit having a second control input and coupled in parallel to the tunable resonator subcircuit, where the variable negative-resistance subcircuit is configured to provide a variable negative resistance, responsive to the control input, so as to increase the effective parallel resistance of the tank circuit.

Also detailed herein are corresponding methods for providing a variable resonance, in a tank circuit comprising a tunable resonator subcircuit and a variable negative-resistance subcircuit coupled in parallel to the tunable resonator subcircuit. An example of such a method comprises controlling the tunable resonator subcircuit to tune a resonant frequency of the tunable resonator subcircuit, via a control input of the tunable resonator subcircuit, the tunable resonator subcircuit having an effective parallel resistance that varies with tuning of the tunable resonator subcircuit. This method further comprises controlling the variable negative-resistance subcircuit, via a control input of the variable negative-resistance subcircuit, wherein the variable negative-resistance subcircuit is configured to provide a variable negative resistance, responsive to the control input of the negative-resistance subcircuit, so as to increase the effective parallel resistance of the tank circuit.

In some embodiments, the techniques described herein may be applied to enhancing the tuning range of a transceiver that comprises an amplifier stage and a tank circuit, where the tank circuit comprises a tunable resonator subcircuit and a variable negative-resistance subcircuit coupled in parallel to the tunable resonator subcircuit. An example method according to these embodiments may include the step of controlling the tunable resonator subcircuit of the tank circuit in the transceiver to tune a resonant frequency of the tunable resonator subcircuit, via a control input of the tunable resonator subcircuit, the tunable resonator subcircuit having an effective parallel resistance that varies with tuning of the tunable resonator subcircuit. The example method may further comprise the step of controlling the variable negative-resistance subcircuit, via a control input of the variable negative-resistance subcircuit, where the variable negative-resistance subcircuit is configured to provide a variable negative resistance responsive to the control input of the negative-resistance subcircuit, so as to increase the effective parallel resistance of the tank circuit in the transceiver.

Variations of the above-summarized circuits and techniques and advantages in addition to those discussed above are described below, with reference to the attached figures.

DETAILED DESCRIPTION

Figure 1:
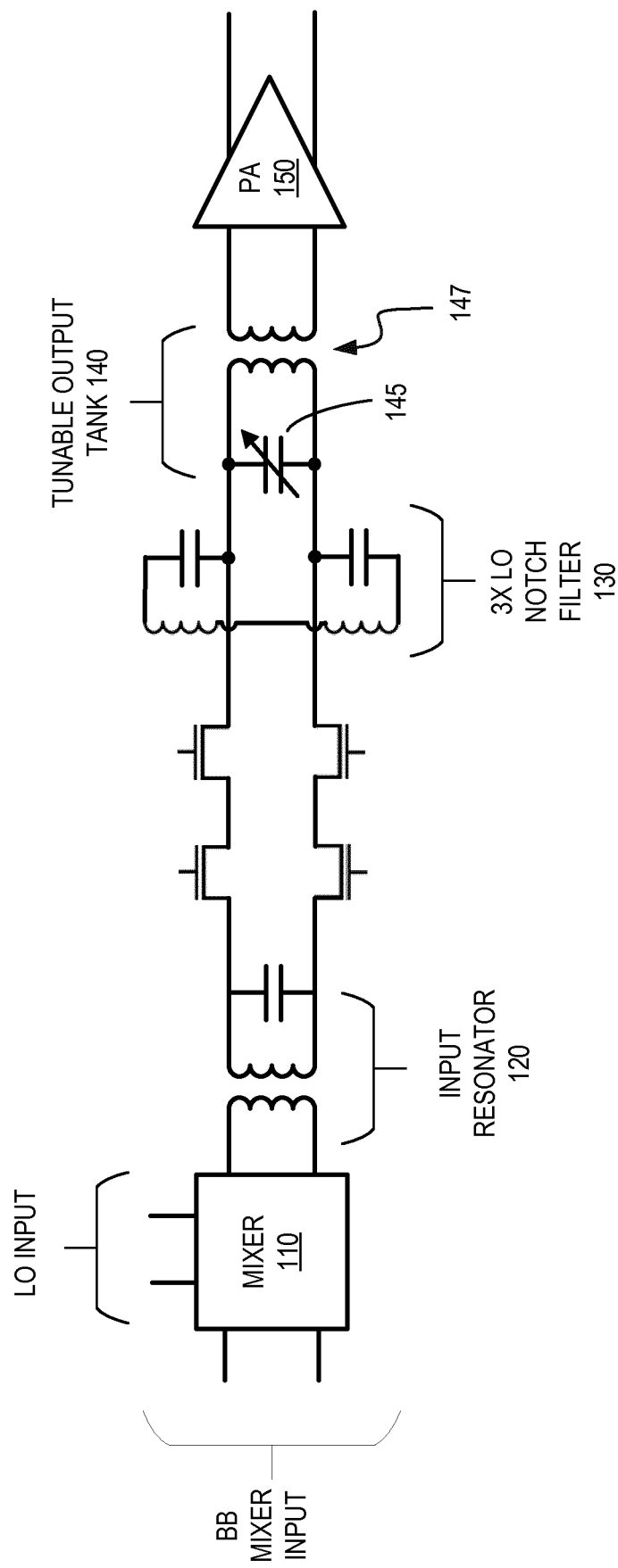
FIG. 1 illustrates a transmitter circuit, including a power amplifier, a mixer circuit, and a tunable resonator circuit.
Figure 2:
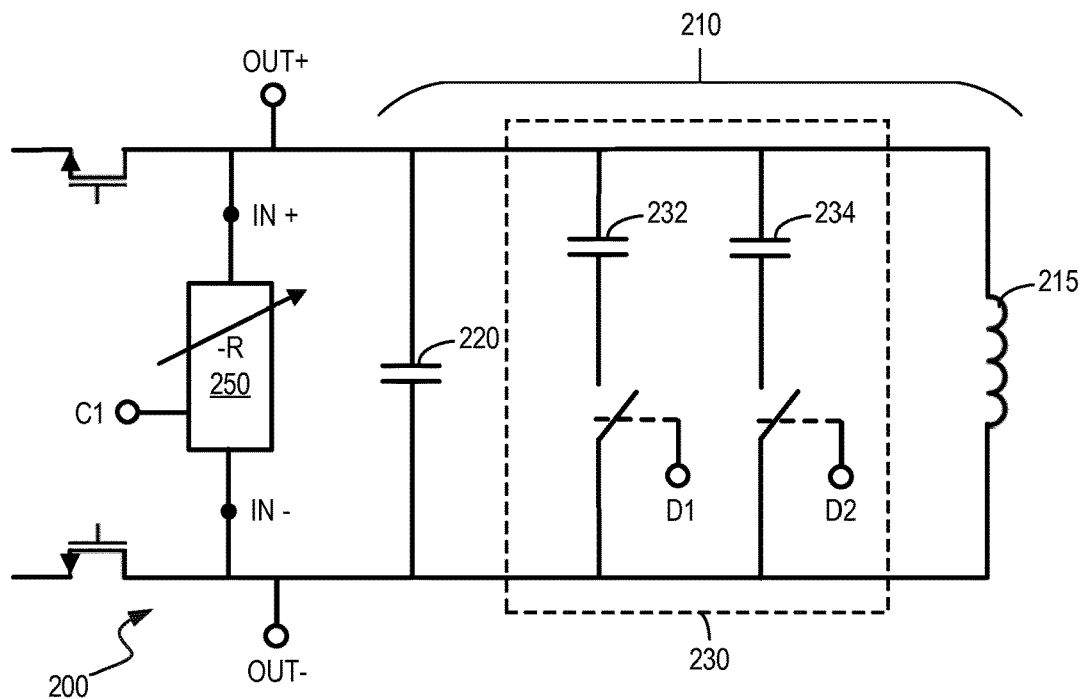
FIG. 2 illustrates a tank circuit according to some embodiments.

FIG. 2 illustrates a simple example of a tank circuit 200, according to some embodiments. Tank circuit 200 and variants thereof may be substituted for the tunable output tank 140, for example, but may also be used in many other circuits where improved control of Q and/or effective parallel resistance over a wide tuning range is desired.

Tank circuit 200 includes a tunable resonator subcircuit 210, here a parallel-resonant circuit that includes an inductor 215, a capacitor 220, and a switched capacitor bank 230. Capacitor 220 may represent a parasitic circuit capacitance, in some embodiments. Likewise, while a simple inductor 215 is shown, this inductor may be an inductive element in a transformer, a tapped inductor, etc.

The individual capacitor elements 232 and 234 can be switched in or out with switch elements S1 and S2, which are controlled by control inputs D1 and D2. It will be appreciated that inductor 215, capacitor 220, and switched capacitor bank 230 each include intrinsic resistances, which are not explicitly shown in FIG. 2. In some circuits, an additional resistor or resistors may be added, for further control of the circuit's Q. These intrinsic resistances (and any added resistances) together produce an effective parallel resistance Rp for the tunable resonator subcircuit 210.

The capacitance of the tunable resonator subcircuit 210 can be adjusted by switching in or out capacitor elements 232 and 234. In the illustrated circuit, two switchable capacitors are provided, which allows for the selection of four different effective capacitances, i.e., with capacitor 232 only selected, capacitor 234 only selected, both capacitor 232 and 234 selected, and neither capacitor selected. It will be appreciated that other tunable resonator subcircuits may comprise more or fewer switchable capacitors, arranged in various configurations to achieve more or less tuning range and/or coarser or finer tuning. Still other tunable resonator subcircuits may incorporate a varactor, instead of or in addition to one or all of the switchable capacitors. Tunable resonator subcircuits with tunable inductances are also possible, although they may be less practical for very small circuit footprints. Likewise, while tunable resonator subcircuit 210 is a parallel-resonant circuit, tunable series-resonant circuits may also be used.

Returning to FIG. 2, tank circuit 200 further includes a variable negative-resistance subcircuit 250. This circuit, which is coupled in parallel to the tunable resonator subcircuit 210, has a control input, labeled C1 in FIG. 2, and is configured to provide a variable negative resistance, responsive to a control signal applied to control input C1. More particularly, variable negative-resistance subcircuit 250 is configured to provide a variable (i.e., adjustable) negative resistance (−R) that increases the effective parallel resistance of the overall tank circuit 200. Note that this implies that the magnitude of the negative resistance (−R) is greater than the magnitude of the effective parallel resistance Rp of the tunable resonator subcircuit 210. This ensures stability, and increases the Q of the tank circuit 200, as compared to the Q that would result if the variable negative-resistance subcircuit 250 were omitted. In other words, the variable negative-resistance subcircuit 250 can counteract Q degradation that might otherwise occur as the tunable resonator subcircuit 210 is adjusted. In some embodiments, the amount of negative resistance can be controlled, so as to maintain a relatively constant Q across a very wide tuning range for the tank circuit 200.

In a practical tank circuit, a couple of mechanisms contribute to the degradation/variation in Q and effective parallel resistance. First, the equivalent parallel resistance (Rp) of an LC tank is proportional to frequency. To be more exact:

$$Rp = 2pi \times f \times Q \times L,$$

where f is the resonant frequency. Alternatively:

$$Rp = Q/(2pi \times f \times C).$$

A portion of the Rp degradation at lower frequencies is explained by this. Secondly, the degradation of the resonator's Q is due to the degradation of the capacitor's Q, as the Q of a capacitor can be expressed as:

$$Q = 1/(2pi \times f \times C \times ESR),$$

where ESR (electrical series resistance) is the series resistance of a capacitor element. In a switched capacitor bank, such as shown in FIG. 2, this ESR may be dominated by the on-resistance of the switch transistors S1 and S2. Since fres=1/sqrt(LC), lowering the frequency requires the switched-in capacitance to increase quadratically. This means that, with a constant ESR, the Q of the capacitor decreases when the resonance frequency is tuned to lower frequencies, since the percentage of capacitance increase is the square of the percentage of frequency decrease. In other words, in the capacitor Q formula given above, to halve the frequency, the capacitor value must be multiplied by four, which results in half the Q-value. Thirdly, since the physical area of the capacitor bank increases quadratically, with decreased resonant frequency for the tunable resonator subcircuit 210, the interconnect parasitics become significant and further degrade the capacitor bank's Q. When the capacitor bank Q degrades, the resonator Q also degrades.

It should be appreciated that Rp, the effective parallel resistance of the tunable resonator subcircuit 210, is lowered both by Q degradation and by reductions in frequency. If the resonator is used as a transimpedance load, i.e., for converting an output current of a block to a voltage, the gain of the block will decrease at low frequencies through both mechanisms.

If the previous driving block is a transimpedance block and its transimpedance gm is programmable by some means (e.g., by selectable transistor width or with a variable bias voltage) the gain drop can be compensated, at the cost of current consumption. The Q, and hence the sharpness/band pass filtering capability of the resonator will still be low. But, gm programmability might not always be possible or desired, since, for example, changing the bias/gm conditions of an low-noise amplifier will alter its input impedance and adversely impact matching to the amplifier. As another example, the driving stage might be a common gate current buffer, where increasing gm does not increase output current.

The variable negative resistance provided by variable negative-resistance subcircuit 250 in the example circuit of FIG. 2 can be used to restore the Q and effective parallel resistance of the overall tank circuit 200. In some embodiments, it is enabled only at the tuning settings where Q and Rp enhancement are necessary. As a practical matter, this enhances the usable frequency range of the resonator, since both Q and effective parallel resistance of the tank circuit are made adjustable programmable, so that their variations can be kept within acceptable limits over a wider frequency range than would otherwise be possible. In some embodiments, the switching in or adjustment of negative resistance is programmable, so that only the needed amount of negative resistance is applied, to avoid excessive Q increases and/or to avoid circuit instability/oscillations.

Figure 3A:
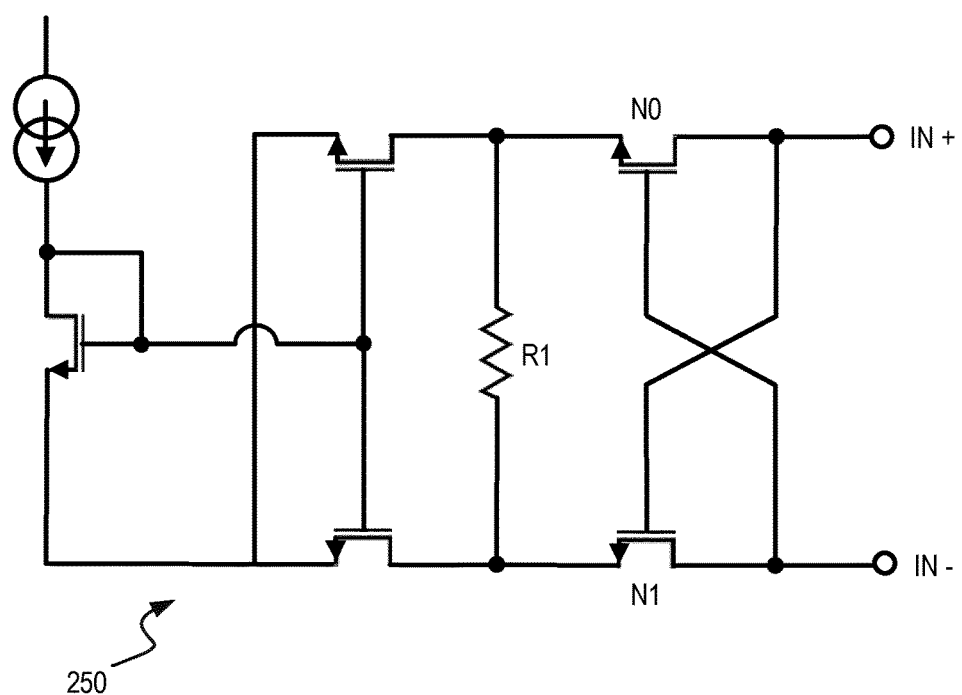
FIGS. 3A, 3B, and 3C illustrate example negative-resistance subcircuits, according to some embodiments.
Figure 3B:
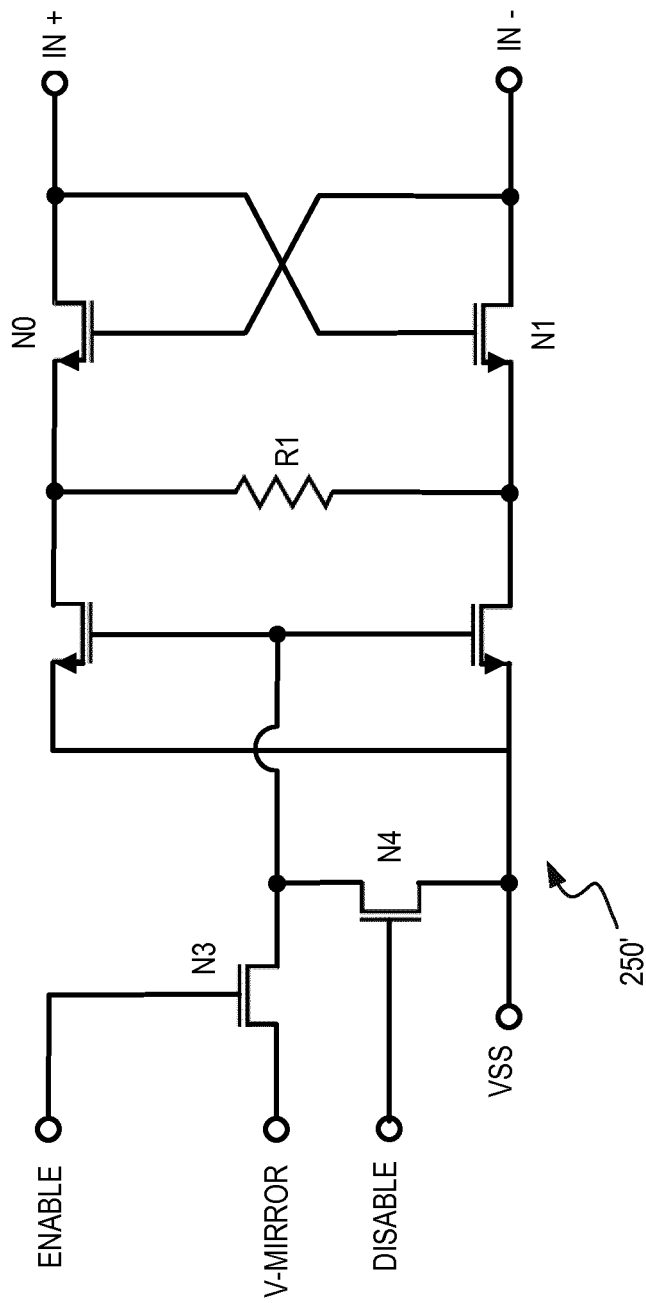
Figure 3C:
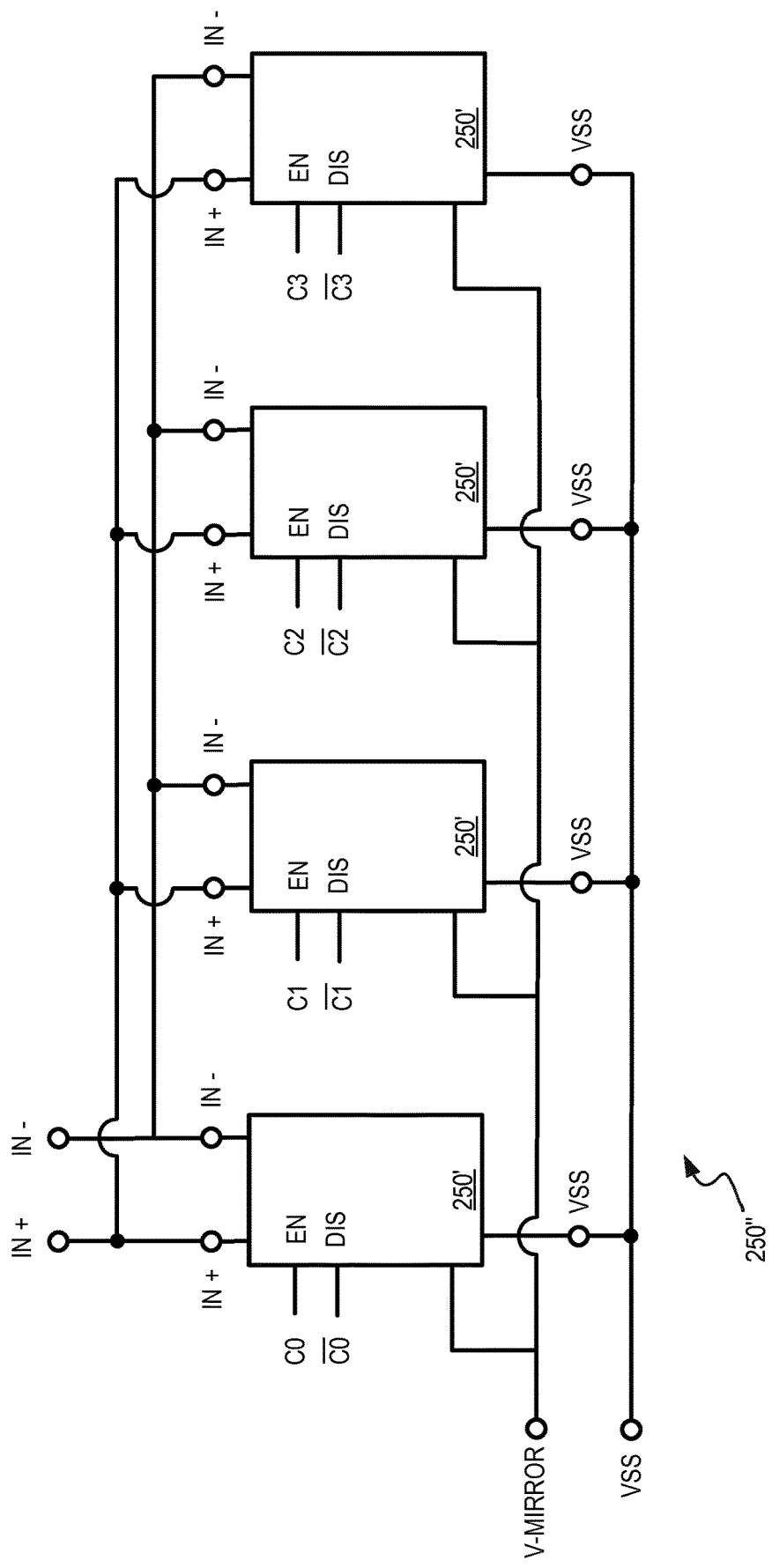

FIGS. 3A, 3B, and 3C illustrate example negative-resistance subcircuits according to various embodiments. FIG. 3A illustrates basic details of a first example negative-resistance subcircuit 250, here implemented as a cross-coupled transistor pair, i.e., transistors N0 and N1, each of which has its gate coupled to the other transistor's drain. The impedance seen by the drains of the cross-coupled transistor pair in FIG. 3 is:

$$Zin = -2/gm - 2 \times R1.$$

The cross-coupled transistor pair negates the impedance between its sources (2×R1 in this case) and adds its own negative impedance (−2/gm). R1 (which may be zero, in some embodiments) helps to linearize the cross-coupled transistor pair, at the cost of lower gain from resonator. In some embodiments, R1 may be programmable, in case linearity improvements are necessary in some conditions. With R1=0 and an example gm of 6.1 mS:

$$Zin = -1/6.1\ mS = -328\ Ohms = Rneg$$

At resonance, impedance of the LC tank is equal to Rp. Connecting Rneg in parallel to the tunable resonator subcircuit 210 yields an effective parallel resistance Rp_new for the overall tank circuit:

$$Rp\_new = Rp \times Rneg/(Rp + Rneg).$$

It will be observed that if (Rp+Rneg)=0, Rp_new becomes infinite, and the circuit is unstable. If Rneg is negative and (Rp+Rneg)>0, then Rp_new is negative and the circuit might be unstable. If Rneg is negative and (Rp+Rneg)<0, Rp_new is positive, the circuit is stable. So, to ensure stable operation (where the cross-coupled transistor pair remains in small-signal operation), the magnitude of Rneg should be greater than the magnitude of the effective parallel resistance Rp of the tunable resonator subcircuit 210, i.e., Rp<−Rneg.

In an example circuit designed for high-frequency operation, e.g., at 25-30 GHz, Rp roughly varies between 120 ohms to 200 ohms over frequency. Given Rp=120 ohms at 25 GHz:

$$Rp\_new\_25G = Rp \times Rneg/(Rp+Rneg) = 120 \times (-328)/(120-328) = 189\ ohms.$$

Thus, it can be seen that the addition of the negative resistance restores the effective parallel resistance of the resonator (i.e., the overall tank circuit) close to the value it has at higher frequencies, without negative resistance, i.e., close to 200 ohms. So, by selectively switching in or adjusting the negative resistance contributed by the variable negative-resistance subcircuit 250, when the tunable resonator subcircuit 210 is tuned to resonant frequencies towards the low end of the operating frequency range, the effective parallel resistance of the tank circuit can be maintained at a near constant value, or, at least, maintained within an acceptable range of variation. At the same time, the Q of the tank circuit, which is proportional to the effective parallel resistance, is also maintained.

FIG. 3B illustrates another example of a negative-resistance subcircuit. Negative-resistance subcircuit 250' can be substituted for the negative-resistance subcircuit 250 in FIG. 2, for example. In this circuit, transistors N3 and N4 are used to selectively enable or disable the cross-coupled transistor portion of the subcircuit, where enabling the subcircuit causes a negative resistance to be presented to terminals IN+ and IN−. The ENABLE and DISABLE inputs are complementary; thus, a single control bit can be converted into complementary gate signals ENABLE and DISABLE, for selectively turning the negative resistance on or off, as desired. As discussed above, the negative resistance can be switched on when the tunable tank circuit in which this subcircuit is used is tuned towards the low end of the operating frequency, to reduce variations in Q and effective parallel resistance for the tunable tank circuit.

FIG. 3C shows how this approach can be extended so that the negative-resistance subcircuit includes several selectable negative-resistance cells, so as to form a negative-resistance subcircuit 250" that can be considered a "negative resistance bank." Again, negative-resistance subcircuit 250" can be substituted for the negative-resistance subcircuit 250 in FIG. 2, for example.

In the circuit of FIG. 3C, four digitally controllable negative-resistance subcircuits 250' are connected in parallel, but with separate control inputs C0/C0', C1/C1', C2/C2', and C3/C3', thus providing for sixteen negative resistance states, corresponding to the sixteen different ways in which none, some, or all of the negative-resistance subcircuits 250' are enabled. Note that while negative-resistance subcircuit 250" is shown with four seemingly identical negative-resistance subcircuits 250', the negative resistance provided by each of these negative-resistance subcircuits may vary. For instance, in some embodiments a first negative-resistance subcircuit 250' may comprise a single cross-coupled pair, while a second negative-resistance subcircuit 250' may comprise two cross-coupled pairs, in parallel, while a third negative-resistance subcircuit 250' comprises four cross-coupled pairs, in parallel, and so on. If this approach is applied to the negative-resistance subcircuit 250" in FIG. 2, for instance, the sixteen negative resistance states would allow for the selection of negative resistances from 0, −R, −2R, . . . , −15R, where the lowest order subcircuit 250' provides −R when enabled, the second lowest order subcircuit 250' provides −2R, and so on. Note that of these sixteen states, one is a state in which no negative resistance is presented to the terminals IN+ and IN−.

The techniques and subcircuits described above can be said to improve, enhance, or increase the tuning range of a tunable resonator circuit. While the addition of the variable-negative resistance circuit does not directly increase the tuning range of the circuit, the degradation of Q and Rp at lower frequencies in many practical circuits limits the usable tuning range, thus limiting the circuit designer's ability to increase the tuning range by, for example, providing for more capacitance to be switched in and the lower limit of the useful tuning range to be reduced. With the techniques described here, this issue is resolved, allowing for more capacitance to be switched in and providing for an increase in the usable tuning range of the circuit. In addition to providing better performance of circuits that need to be adjusted during operation to operate over a wide range of frequencies, these techniques can make it more practical for a single circuit design to accommodate a wider range of uses, for instance as new operating bands for wireless communications are introduced.

It should therefore be appreciated that FIGS. 2 and 3A, 3B, and 3C together show several illustrative examples of how to design a tank circuit with enhanced tuning ability, with the variable negative-resistance subcircuit 250/250'/250" allowing for compensation and restoration of the degraded Q and effective parallel resistance of tunable resonator subcircuit 210 as the circuit is tuned. As indicated above, many variations of these example circuits are possible. Generally speaking, however, embodiments may include a tunable resonator subcircuit having a first control input for tuning the resonant frequency of the tunable resonator subcircuit, with the tunable resonator subcircuit having an effective parallel resistance that varies with tuning of the tunable resonator subcircuit, as well as a variable negative-resistance subcircuit coupled in parallel to the tunable resonator subcircuit, with the variable negative-resistance subcircuit having a second control input. The variable negative-resistance subcircuit in these embodiments is configured to provide a variable negative resistance, responsive to the control input, so as to increase the effective parallel resistance of the tank circuit.

The tank circuit may further include a control circuit coupled to the first control input and the second control input. An example of this is shown in the example transmitter circuit 400 illustrated in FIG. 4, which includes a tank circuit 200 interposed between a mixer circuit 410 and a power amplifier 420, with control circuit 430 being configured to control the first and second control inputs CTRL1 and CTRL2 to adjust the resonant frequency of the tank circuit and the negative resistance therein, respectively. Control circuit 430 may comprise digital logic and/or one or more microprocessors, microcontrollers, or the like, coupled to a memory storing suitable program code for execution by the microprocessor(s) or microcontroller(s), and is configured to adjust the negative resistance along with at least some adjustments to the resonant frequency of tunable resonator subcircuit 210. In some embodiments, for example, control circuit 430 is configured to control the second control input CTRL2 (which may comprise several bits, for example) so as to increase the negative resistance presented by the variable negative-resistance subcircuit 250 in response to adjustments (made via control input CTRL1) that lower resonant frequency of the tunable resonator subcircuit 210. It will be appreciated that the example subcircuits 250' and 250" shown in FIGS. 3B and 3C, as well as other examples of variable negative-resistance subcircuits, may be substituted for the variable negative-resistance subcircuit 250 in the circuit of FIG. 4.

In some embodiments, the second control input CTRL2 is a digital control input, and the variable negative-resistance subcircuit is configured to selectably present one of two or more negative resistance states, responsive to the digital control input, so as to provide a negative resistor bank, i.e., a set of discrete negative resistance values from which a desired negative resistance can be selected. In some of these embodiments, one of these two or more negative resistance states may present no negative resistance to the tank circuit.

In some embodiments, for example, the digital control input is a 4-bit digital control input, and wherein the variable negative-resistance subcircuit is configured to selectably present one of sixteen negative resistance states, responsive to the 4-bit digital control input.

In some embodiments, e.g., as shown in the example circuit of FIG. 2, the tunable resonator subcircuit 210 comprises a switchable capacitor bank 230 connected in parallel with a transformer or inductor 215, where the variable negative-resistance subcircuit 250 is connected in parallel with the switchable capacitor bank 230.

In some embodiments, e.g., as shown in the example circuit of FIG. 3, the variable negative-resistance subcircuit comprises at least one pair of cross-coupled common source transistors, each of the common source transistors having a transconductance and being controlled by a bias input its respective gate, such that the negative resistance provided by the variable negative-resistance subcircuit derives from the transconductances of the common-source transistors.

Figure 4:
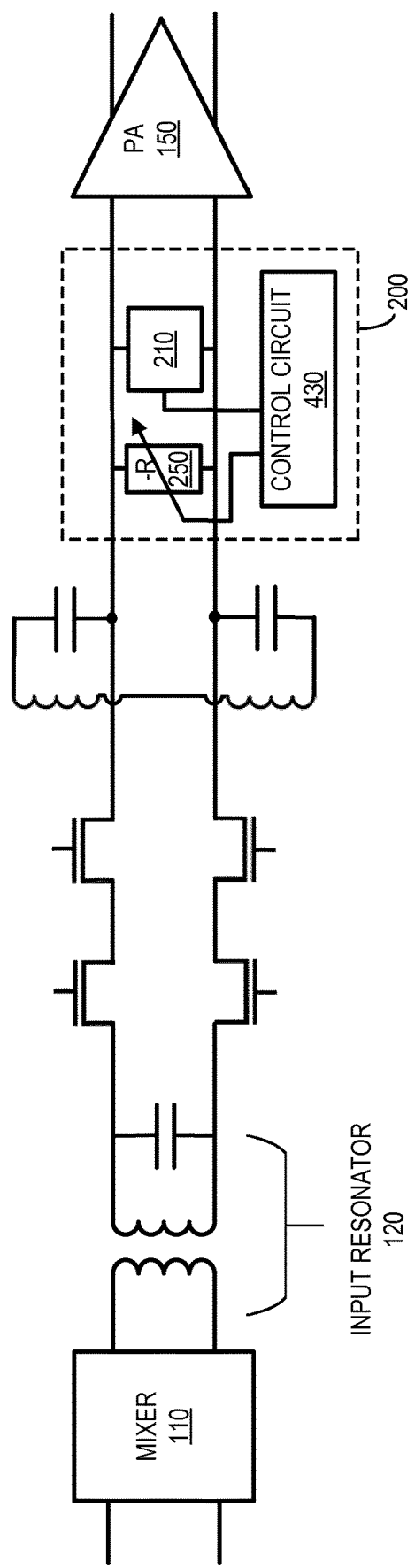
FIG. 4 illustrates an example transmitter circuit, according to some embodiments.
Figure 5:
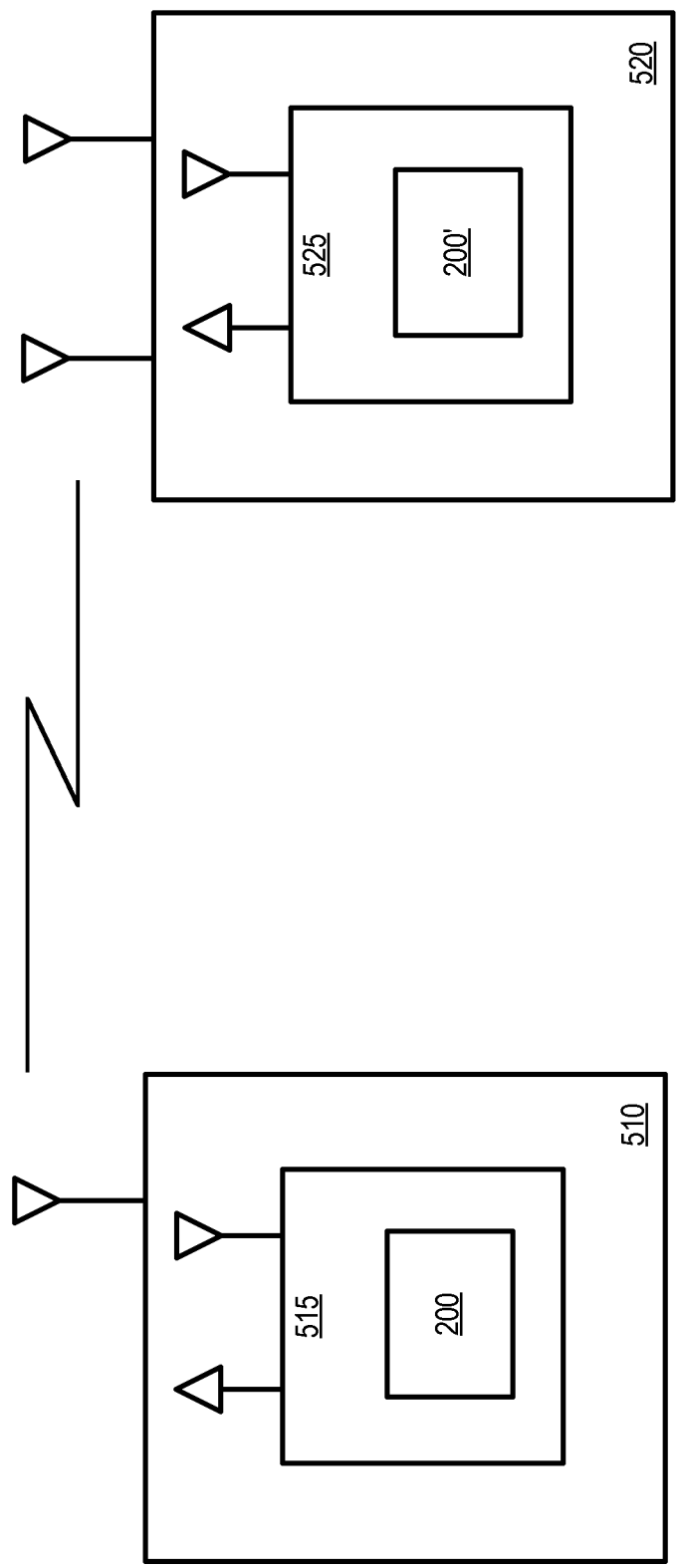
FIG. 5 illustrates an example user equipment (UE) and base station, according to some embodiments.

As shown in FIG. 4, a tank circuit like those discussed above may be coupled to an input of an amplifier stage, so as to form part of an amplifier circuit in a receiver circuit or transmitter circuit. Similarly, a transmitter circuit may comprise a mixer circuit and an amplifier stage, with a tank circuit like those discussed above coupled to an output of the mixer circuit and to an input of the amplifier stage. Any of these circuits may be used in a transceiver of a wireless device, for example, such as a base station or user equipment. FIG. 5 illustrates an example user equipment 510 and base station 520, for instance, comprising transceiver circuits 515 and 525, respectively, with these transceiver circuits in turn comprising respective tunable tank circuits 200 and 200' according to any of the various embodiments described herein. Of course, it will be appreciated that tank circuits like those described herein may be used in any number of circuit configurations where tunable resonance and compensation of Q and effective parallel resistance is desired.

Figure 6:
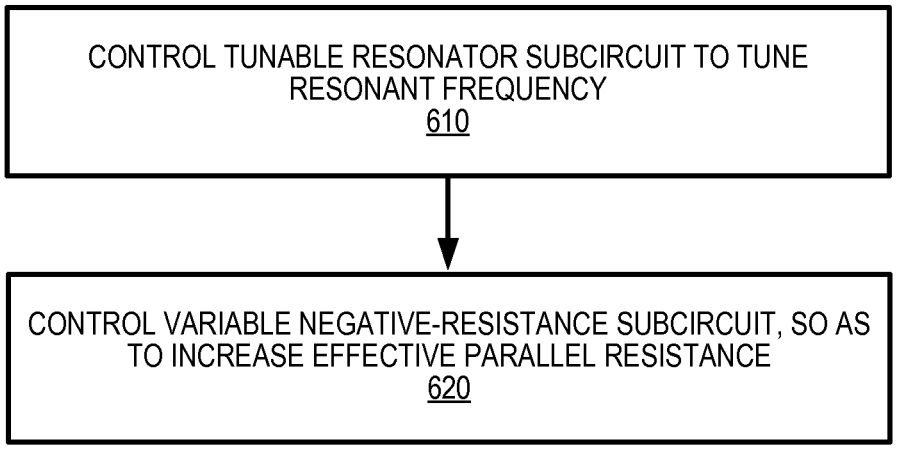
FIG. 6 is a process flow diagram illustrating an example method, according to some embodiments.

Corresponding to the various circuits described above are methods for providing a variable resonance in a tank circuit that comprises a tunable resonator subcircuit and a variable negative-resistance subcircuit coupled in parallel to the tunable resonator subcircuit. An example is illustrated in FIG. 6, and includes, as shown at block 610, the step of controlling the tunable resonator subcircuit to tune a resonant frequency of the tunable resonator subcircuit, via a control input of the tunable resonator subcircuit, the tunable resonator subcircuit having an effective parallel resistance that varies with tuning of the tunable resonator subcircuit. The method further includes controlling the variable negative-resistance subcircuit, via a control input of the variable negative-resistance subcircuit, where the variable negative-resistance subcircuit is configured to provide a variable negative resistance responsive to the control input, so as to increase the effective parallel resistance of the tank circuit. This is shown at block 620 of FIG. 6. it will be appreciated that the steps shown in blocks 610 and 620 may be performed in any order, or simultaneously, in various embodiments.

In some embodiments, as discussed above, controlling the variable negative-resistance subcircuit comprises controlling the variable negative-resistance subcircuit so as to increase the negative resistance presented by the switchable negative-resistance subcircuit in response to a change in the tunable resonator subcircuit that lowers the resonant frequency of the tunable resonator subcircuit. In some embodiments, the control input to the negative-resistance subcircuit is a digital control input and controlling the variable negative-resistance subcircuit comprises selecting one of two or more negative resistance states for the variable negative-resistance subcircuit, using the digital control input, so as to select a negative resistance from a negative resistor bank. In some embodiments, for example, the digital control input is a 4-bit digital control input and controlling the variable negative-resistance subcircuit thus comprises selecting one of sixteen negative resistance states for the variable negative-resistance subcircuit, using the 4-bit digital control input.

In some embodiments, the tunable resonator subcircuit comprises a switchable capacitor bank connected in parallel with a transformer or inductor, where the switchable negative-resistance subcircuit is connected in parallel with the switchable capacitor bank, and where controlling the tunable resonator subcircuit comprises selecting one of two or more selectable capacitances, using the control input to the tunable resonator subcircuit. In some of these and in other embodiments, the variable negative-resistance subcircuit comprises cross-coupled common source transistors, each having a transconductance and each controlled by a bias input to each gate of the common source transistors, such that the negative resistance provided by the variable negative-resistance subcircuit derives from the transconductances of the common-source transistors.

Figure 7:
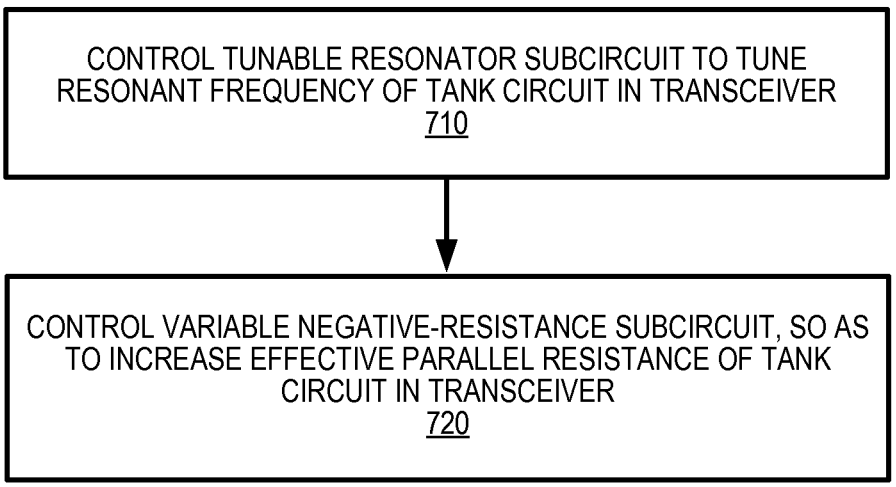
FIG. 7 is a process flow diagram illustrating another example method, according to some embodiments.

FIG. 7 illustrates an example method in which the techniques described above are applied to enhancing the tuning range of a transceiver that comprises an amplifier stage and a tank circuit, where the tank circuit comprises a tunable resonator subcircuit and a variable negative-resistance subcircuit coupled in parallel to the tunable resonator subcircuit. This method comprises, as shown at block 710, controlling the tunable resonator subcircuit of the tank circuit in the transceiver to tune a resonant frequency of the tunable resonator subcircuit, via a control input of the tunable resonator subcircuit, the tunable resonator subcircuit having an effective parallel resistance that varies with tuning of the tunable resonator subcircuit. The method further comprises, as shown at block 720, controlling the variable negative-resistance subcircuit, via a control input of the variable negative-resistance subcircuit, where the variable negative-resistance subcircuit is configured to provide a variable negative resistance responsive to the control input of the negative-resistance subcircuit, so as to increase the effective parallel resistance of the tank circuit in the transceiver. Again, these steps may be performed in either order, or simultaneously. Further, any of the variations described above, e.g., in connection with the method illustrated in FIG. 6, may be applied to the method shown in FIG. 7 as well.

It should be noted that the above-described embodiments illustrate, rather than limit the invention, and that those skilled in the art will be able to design and use many alternative embodiments without departing from the scope of the appended claims. The word "comprising" as used herein does not exclude the presence of elements or steps in addition to those listed in a claim, the words "a" and "an" do not exclude a plurality, and a single processor or other unit may fulfil the functions of several units recited in the claims.

The invention claimed is:
1. A tank circuit, comprising:
   a tunable resonator subcircuit having a first control input for tuning the resonant frequency of the tunable resonator subcircuit, the tunable resonator subcircuit having an effective parallel resistance that varies with tuning of the tunable resonator subcircuit;

a variable negative-resistance subcircuit having a second control input and coupled in parallel to the tunable resonator subcircuit, wherein the variable negative-resistance subcircuit is configured to provide a variable negative resistance, responsive to the second control input, so as to increase the effective parallel resistance of the tank circuit; and a control circuit coupled to the first control input and the second control input, wherein the control circuit is configured to control the second control input so as to increase the negative resistance presented by the variable negative-resistance subcircuit in response to a change in the tunable resonator subcircuit that lowers the resonant frequency of the tunable resonator subcircuit.

2. The tank circuit of claim 1, wherein the second control input is a digital control input, and wherein the variable negative-resistance subcircuit is configured to selectably present one of two or more negative resistance states, responsive to the digital control input, so as to provide a negative resistor bank.

3. The tank circuit of claim 2, wherein one of the two or more negative resistance states is a state in which no negative resistance is presented by the negative-resistance subcircuit.

4. The tank circuit of claim 2, wherein the digital control input is a 4-bit digital control input, and wherein the variable negative-resistance subcircuit is configured to selectably present one of sixteen negative resistance states, responsive to the 4-bit digital control input.

5. The tank circuit of claim 1, wherein the tunable resonator subcircuit comprises a switchable capacitor bank connected in parallel with a transformer or inductor, and wherein the variable negative-resistance subcircuit is connected in parallel with the switchable capacitor bank.

6. The tank circuit of claim 1, wherein the variable negative-resistance subcircuit comprises cross-coupled common source transistors, each having a transconductance and each controlled by a bias input to each gate of the common source transistors, such that the negative resistance provided by the variable negative-resistance subcircuit derives from the transconductances of the common-source transistors.

7. An amplifier circuit comprising an amplifier stage and the tank circuit of claim 1, wherein the tank circuit is coupled to an input of the amplifier stage.

8. A receiver circuit comprising the amplifier circuit of claim 7.

9. A transmitter circuit comprising a mixer circuit and amplifier stage and the tank circuit of claim 1, wherein the tank circuit is coupled to an output of the mixer circuit and to an input of the amplifier stage.

10. A transceiver circuit comprising the receiver circuit of claim 8.

11. A wireless device comprising the transceiver circuit of claim 10.

12. A transceiver circuit comprising the transmitter circuit of claim 9.

13. A wireless device comprising the transceiver circuit of claim 12.

14. A method for providing a variable resonance in a tank circuit comprising a tunable resonator subcircuit and a variable negative-resistance subcircuit coupled in parallel to the tunable resonator subcircuit, the method comprising:

controlling the tunable resonator subcircuit to tune a resonant frequency of the tunable resonator subcircuit, via a control input of the tunable resonator subcircuit, the tunable resonator subcircuit having an effective parallel resistance that varies with tuning of the tunable resonator subcircuit; and controlling the variable negative-resistance subcircuit, via a control input of the variable negative-resistance subcircuit, wherein the variable negative-resistance subcircuit is configured to provide a variable negative resistance responsive to the control input of the negative-resistance subcircuit, so as to increase the effective parallel resistance of the tank circuit, and wherein controlling the variable negative-resistance subcircuit comprises controlling the variable negative-resistance subcircuit so as to increase the negative resistance presented by the switchable negative-resistance subcircuit in response to a change in the tunable resonator subcircuit that lowers the resonant frequency of the tunable resonator subcircuit.

15. The method of claim 14, wherein the control input to the negative-resistance subcircuit is a digital control input, and wherein controlling the variable negative-resistance subcircuit comprises selecting one of two or more negative resistance states for the variable negative-resistance subcircuit, using the digital control input, so as to select a negative resistance from a negative resistor bank.

16. The method of claim 15, wherein one of the two or more negative resistance states is a state in which no negative resistance is presented by the negative-resistance subcircuit.

17. The method of claim 15, wherein the digital control input is a 4-bit digital control input, and wherein controlling the variable negative-resistance subcircuit comprises selecting one of sixteen negative resistance states for the variable negative-resistance subcircuit, using the 4-bit digital control input.

18. The method of claim 14, wherein the tunable resonator subcircuit comprises a switchable capacitor bank connected in parallel with a transformer or inductor, wherein the switchable negative-resistance subcircuit is connected in parallel with the switchable capacitor bank, and wherein controlling the tunable resonator subcircuit comprises selecting one of two or more selectable capacitances, using the control input to the tunable resonator subcircuit.

19. The method of claim 14, wherein the variable negative-resistance subcircuit comprises at least one pair of cross-coupled common source transistors, each of the cross-coupled common-source transistors having a transconductance and each of the cross-coupled common-source transistors being arranged to be controlled by a bias input its respective gate, such that the negative resistance provided by the variable negative-resistance subcircuit derives from the transconductances of the common-source transistors.

20. A method of enhancing the tuning range of a transceiver that comprises an amplifier stage and a tank circuit, the tank circuit comprising a tunable resonator subcircuit and a variable negative-resistance subcircuit coupled in parallel to the tunable resonator subcircuit, wherein the method comprises:

controlling the tunable resonator subcircuit of the tank circuit in the transceiver to tune a resonant frequency of the tunable resonator subcircuit, via a control input of the tunable resonator subcircuit, the tunable resonator subcircuit having an effective parallel resistance that varies with tuning of the tunable resonator subcircuit; and controlling the variable negative-resistance subcircuit, via a control input of the variable negative-resistance subcircuit, wherein the variable negative-resistance subcircuit is configured to provide a variable negative resistance responsive to the control input of the negative-resistance subcircuit, so as to increase the effective parallel resistance of the tank circuit in the transceiver, and wherein controlling the variable negative-resistance subcircuit comprises controlling the variable negative-resistance subcircuit so as to increase the negative resistance presented by the switchable negative-resistance subcircuit in response to a change in the tunable resonator subcircuit that lowers the resonant frequency of the tunable resonator subcircuit.

21. The method of claim 20, wherein the control input to the negative-resistance subcircuit is a digital control input, and wherein controlling the variable negative-resistance subcircuit comprises selecting one of two or more negative resistance states for the variable negative-resistance subcircuit, using the digital control input, so as to select a negative resistance from a negative resistor bank.

* * * * *